United States Patent
Cho et al.

(10) Patent No.: US 6,806,180 B2
(45) Date of Patent: Oct. 19, 2004

(54) UNITARY INTERCONNECTION STRUCTURES INTEGRAL WITH A DIELECTRIC LAYER

(75) Inventors: Won-Seok Cho, Seongnam-si (KR); Soon-Moon Jung, Yongin-si (KR); Sung-Bong Kim, Suwon-si (KR); Hyung-Shin Kwon, Osan-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/426,266

(22) Filed: Apr. 30, 2003

(65) Prior Publication Data

US 2004/0018725 A1 Jan. 29, 2004

(30) Foreign Application Priority Data

Jul. 26, 2002 (KR) ................ 10-2002-0044226

(51) Int. Cl.[7] .................................. H01L 21/4763
(52) U.S. Cl. ...................... 438/618; 438/598
(58) Field of Search ................ 438/618, 197, 438/598, 624, 626, 631, 163, 381, 692, 740

(56) References Cited

U.S. PATENT DOCUMENTS

| | | | | |
|---|---|---|---|---|
| 5,610,083 A | * | 3/1997 | Chan et al. ............ | 438/381 |
| 5,683,941 A | * | 11/1997 | Kao et al. ............ | 438/598 |
| 5,811,350 A | * | 9/1998 | Dennison ............ | 438/587 |
| 6,071,799 A | * | 6/2000 | Park et al. ............ | 438/595 |
| 6,083,827 A | * | 7/2000 | Lin et al. ............ | 438/631 |
| 6,534,393 B1 | * | 3/2003 | Zhou et al. ............ | 438/618 |

* cited by examiner

Primary Examiner—David Nhu
(74) Attorney, Agent, or Firm—Myers Bigel Sibley & Sajovec, P.A.

(57) ABSTRACT

An interconnection structure is provided by foiling a first damascene interconnect structure that directly connects a first active area in a substrate, a first conductive line on the substrate and/or a first electrode on the substrate with a second active area in the substrate, a second conductive line on the substrate and/or a second electrode on the substrate. A second damascene interconnect structure may directly connect the first active area, the first conductive line and/or the first electrode to the second active area, the second conductive line and/or the second electrode. The first active area, the first conductive line and/or the first electrode connected to the second active area, the second conductive line and/or the second electrode by the first damascene interconnect structure may be different from the first active area, the first conductive line and/or the first electrode and the second active area, the second conductive line and/or the second electrode connected by the second damascene interconnect structure.

26 Claims, 17 Drawing Sheets

UNITARY INTERCONNECTION STRUCTURES INTEGRAL WITH A DIELECTRIC LAYER

CLAIM FOR PRIORITY

The present application is related to and claims priority from Korean Application No. 2002-44226, filed Jul. 26, 2002, the disclosure of which is incorporated herein as if set forth in its entirety.

FIELD OF THE INVENTION

The present invention relates to semiconductor devices and methods of fabricating semiconductor devices, more specifically, the present invention relates to interconnection structures for semiconductor devices.

BACKGROUND OF THE INVENTION

A semiconductor integrated circuit (IC) typically includes electrically isolated elements, such as a transistor formed at a substrate, a contact hole, and an interconnection selectively connecting the otherwise isolated elements. For example, the contact hole and the interconnection may connect a first active region to a second active region, a first gate electrode to a second gate electrode and/or a gate electrode to active region as needed.

FIG. 1A is a cross-sectional view illustrating a conventional interconnection structure. In FIG. 1A, the region A illustrates an interconnection between active regions, the region B illustrates an interconnection between gate electrodes, and the region C illustrates an interconnection of a gate electrode to an active area. Referring to FIG. 1A, in the region A, a field region 6 is disposed in the substrate 2 to define a first active region 16a and a second active region 16b that are doped with impurities. An interlayer dielectric 20 is provided on the substrate 2. Contact plugs 22 that electrically connect to the active regions 16a and 16b are formed through the interlayer dielectric 20. An interconnection line 34 is provided on the interlayer dielectric 20 to electrically connect the contact plugs 22 to each other. Thus, the first active region 16a is connected to the second active region 16b through the contact plugs 22 and the interconnection line 34.

In the region B of FIG. 1A, an active region 16c doped with impurities is provided in the substrate 2 between field areas 6. A first conductive line 10a and a second conductive line 10b are disposed at respective ones of the field areas 6. While the conductive lines 10a and 10b are formed at the field areas 6 in FIG. 1A, the conductive lines 10a and/or 10b may become a gate electrode when crossing over the active region 16c. An interlayer dielectric 20 is provided on the substrate 2 including the conductive lines 10a and 10b. Contact plugs 24 are connected to the conductive lines 10a and 10b through the interlayer dielectric 20. The contact plugs 24 are also connected to each other through the interconnection line 36. Thus, the contact plugs 24 and the interconnection line 36 electrically connect the first conductive line 10a to the second connective line 10b.

The region C of FIG. 1A illustrates a MOS-transistor having a gate structure and a source/drain region 18 on both sides of the gate structure. The gate structure includes a gate insulator 8, a gate electrode 10c, and spacers 14 on sidewalls of the gate electrode 10c. The source/drain region 18 is provided by a lightly doped region 12 and a heavily doped region 16d. An interlayer dielectric 20 is provided on the substrate 2 having the MOS-transistor. And a contact plug 26 is also formed to electrically connect both the gate electrode 10c of the MOS-transistor and a doped active region 16d through the interlayer dielectric 20. The contact plug 26 is connected to an interconnection line 38.

As mentioned above, conventionally, otherwise electrically isolated regions are electrically connected to each other using contact plugs, such as the contact plugs 22, 24 and 26 and interconnection lines, such as the interconnection lines 34, 36 and 38. The interlayer dielectric 20 is selectively etched to form a contact hole where the contact plugs 22, 24 and 26 will be disposed. Processes for forming a hole pattern to provide contact plugs may become difficult as a semiconductor devices become more highly integrated.

In addition, as the semiconductor device becomes more highly integrated, processes for isolating adjacent patterns may become more difficult. For example, when a misalignment arises in a photolithography process for forming a contact hole on conductive lines 10a and 10b of the region B, an electrical short may occur between the active region 16c doped with impurities and the conductive lines 10a and/or 10b. To overcome this problem, the conductive lines 10a and 10b have been used as an ion implantation mask to provide self-alignment of the active region 16c. Thus, the active region 16c of the region B disposed between the field areas 6 is not doped with impurities if the conductive lines cross the region between the field areas 6. Such a case is illustrated in FIG. 1B. Where the conductive line 10 covers the region between the field areas 6, an unwanted MOS-transistor may be formed that may degrade the performance of the device.

SUMMARY OF THE INVENTION

Embodiments of the present invention provide an interconnection structure of a semiconductor device and methods of fabricating an interconnection structure. In particular embodiments of the present invention, a first active region and a second active region are provided in a substrate. A first field region in the substrate is disposed between the first active region and the second active region and an interlayer dielectric is provided on the substrate. A first unitary interconnection structure contacts and electrically connects the first active region and the second active region, the first unitary interconnection structure being disposed in the interlayer dielectric.

In further embodiments of the present invention, the first active region and the second active region have a surface substantially coplanar with a surface of the substrate. In such embodiments, the first unitary interconnection structure has a first surface that is substantially coplanar with the surface of the substrate and a second surface, opposite the first surface, that is substantially coplanar with a surface of the interlayer dielectric opposite the surface of the substrate.

In additional embodiments of the present invention, the interlayer dielectric includes an etch stop layer on the substrate, a first dielectric layer on the etch stop layer and a second dielectric layer on the first dielectric layer opposite the etch stop layer. Furthermore, the first dielectric layer and the second dielectric layer may have different etch rates with respect to each other.

The first unitary interconnection structure may be a material selected from the group including tungsten, aluminum, copper, titanium, titanium nitride and/or tantalum nitride.

In still further embodiments of the present invention, a third active region is provided in the substrate and second and third field areas in the substrate are provided on opposite sides of the third active region. A first conductive line is on the second field area and a second conductive line is on the third field area. A second unitary interconnection structure contacts the first conductive line and the second conductive line and electrically connects the first conductive line to the second conductive line. The second unitary interconnection structure is disposed in the interlayer dielectric. Furthermore, a portion of the interlayer dielectric is disposed on the third active region and in a gap between the first conductive line and the second conductive line.

In particular embodiments of the present invention, the first conductive line and the second conductive line each have a respective first surface opposite the substrate. The respective first surfaces of the first conductive line and the second conductive line are substantially coplanar. The first surfaces of the first conductive line and the second conductive line are not coplanar with the surface of the substrate. The second unitary interconnection structure has a first surface that is substantially coplanar with the first surfaces of the first and second conductive lines and the second unitary interconnection structure has a second surface, opposite the first surface of the second unitary interconnection structure, that is substantially coplanar with a surface of the interlayer dielectric opposite the surface of the substrate. The second surface of the first unitary interconnection structure and the second surface of the second unitary interconnection structure may also be substantially coplanar.

In other embodiments of the present invention, the portion of the interlayer dielectric disposed on the third active region has a first surface opposite the substrate that is substantially coplanar with the first surfaces of the first and second conductive lines and the first surface of the second unitary interconnection structure.

In further embodiments of the present invention, the first unitary interconnection structure and the second unitary interconnection structure are made of the same conductive material.

Additionally, the first and the second conductive lines may extend to cross over the first active region. In such embodiments, the first and the second conductive lines crossing the first active region may provide a gate electrode of pass transistors in an SRAM and the second unitary interconnection structure may be a word line.

In yet additional embodiments of the present invention, a fourth active region is provided in the substrate and a MOS-transistor formed at the fourth active region. A third unitary interconnection structure contacts and electrically connects a gate electrode of the MOS-transistor to the fourth active region. The third unitary interconnection structure is disposed in the interlayer dielectric. In such embodiments, the first conductive line, the second conductive line and the gate electrode may be made of at least one of polysilicon, silicide, and/or tungsten. Additionally, a first surface of the fourth active region may be substantially coplanar with the surface of the substrate and a first surface of the gate electrode opposite the substrate is not substantially coplanar with the surface of the substrate. The third unitary interconnection structure may also have a first surface that is substantially coplanar with the first surface of the fourth active region, a second surface that is substantially coplanar with the first surface of the gate electrode and a third surface, opposite the first surface and the second surface of the third unitary interconnection structure, that is substantially coplanar with a surface of the interlayer dielectric opposite the surface of the substrate. The first, second and third unitary interconnection structures may also be the same material.

Additional embodiments of the present invention provide for fabricating an interconnection structure in a semiconductor device by forming a first active region in a substrate, forming a second active region in the substrate and forming a first field region in the substrate disposed between the first active region and the second active region. An interlayer dielectric is formed on the substrate and a first opening formed in the interlayer dielectric exposing the first active region and the second active region. The first opening is filled with a conductive material to form a first unitary interconnection structure connecting the first active region to the second active region.

In further embodiments of the present invention, a third active region is formed in the substrate and second and third field areas are also formed in the substrate and on opposite sides of the third active region. A first conductive line is formed on the second field area and a second conductive line is formed on the third field area. A second opening exposing first surfaces of the first conductive line and the second conductive line is formed in the interlayer dielectric. However, the interlayer dielectric remains in a gap between the first and the second conductive lines. The second opening is filled with a conductive material to form a second unitary interconnection structure contacting the first conductive line and the second conductive line and electrically connecting the first conductive line to the second conductive line.

The first and second openings may be formed by selectively etching portions of the interlayer dielectric corresponding to the first opening and the second opening until the first surfaces of the first and second conductive lines are exposed so as to form the first opening having a portion of the interlayer dielectric remaining at a bottom of the first opening and so as to form a second opening having a portion of the interlayer dielectric remaining in a gap between the first conductive line and the second conductive line. Then, the portion of the interlayer dielectric corresponding to the first opening is selectively etched so as to remove the portion of the interlayer dielectric remaining at the bottom of the first opening so as to expose the first active region and the second active region at the bottom of the first opening.

Furthermore, forming an interlayer dielectric may be provided by forming a first interlayer dielectric on the substrate and forming a second interlayer dielectric on the first interlayer dielectric. In such a case, the first and second openings may be formed by selectively etching the second interlayer dielectric until a surface of the first interlayer dielectric is exposed to form the first opening and the second opening. Then a portion of the first interlayer dielectric exposed at a bottom of the first opening is selectively etched to reduce a difference between a thickness of the first interlayer dielectric from the substrate to a bottom of the first opening and a thickness of the first interlayer dielectric from the first surfaces of the first and second conductive lines to a bottom of the second opening. Then the first interlayer dielectric remaining at bottoms of the first opening and the second opening is selectively etched using the second interlayer dielectric as an etching mask to expose the first active region and the second active region at a bottom of the first opening and to expose the first conductive line and the second conductive line at a bottom of the second opening, wherein a portion of the first interlayer dielectric remains between the first conductive line and the second conductive line.

Additionally, forming an interlayer dielectric may also include forming an etch stop layer disposed between the first interlayer dielectric and the substrate. In such a case, forming a first opening and forming a second opening includes removing the etch stop layer exposed at a bottom of the first opening and a bottom of the second opening.

Furthermore, filling the first opening and filling the second opening may be carried out simultaneously. The first unitary interconnection structure and the second unitary interconnection structure may also be made tungsten, aluminum, copper, titanium, titanium nitride, and/or tantalum nitride.

In further embodiments of the present invention, a third active region is formed in the substrate and a transistor formed at the third active region and having an electrode having a first surface that is opposite and spaced apart from a surface of the substrate. A second opening is formed in the interlayer dielectric exposing the first surface of the electrode and the third active region. The second opening is filled with a conductive material to form a second unitary interconnection structure contacting the electrode and the third active region and electrically connecting the electrode to the third active region.

In yet other embodiments of the present invention, an interconnection structure for a semiconductor device is provided by forming a first damascene interconnect structure that directly connects at least one of a first active area in a substrate, a first conductive line on the substrate and/or a first electrode on the substrate to at least one of a second active area in the substrate, a second conductive line on the substrate and/or a second electrode on the substrate. Additionally, a second damascene interconnect structure may also be formed that directly connects at least one of the first active area in a substrate, the first conductive line on the substrate and/or the first electrode on the substrate to at least one of the second active area in the substrate, the second conductive line on the substrate and/or the second electrode on the substrate. At least one of the first active area in a substrate, the first conductive line on the substrate and/or the first electrode on the substrate to at least one of the second active area in the substrate, the second conductive line on the substrate and/or the second electrode on the substrate connected by the first damascene interconnect structure are from the at least one of the first active area in a substrate, the first conductive line on the substrate and/or the first electrode on the substrate to at least one of the second active area in the substrate, the second conductive line on the substrate and/or the second electrode on the substrate connected by the second damascene interconnect structure.

Furthermore, the first damascene interconnect structure and the second damascene interconnect structure may be formed simultaneously and/or of the same material.

DESCRIPTION OF THE PREFERRED EMBODIMENT

Figure 1A:
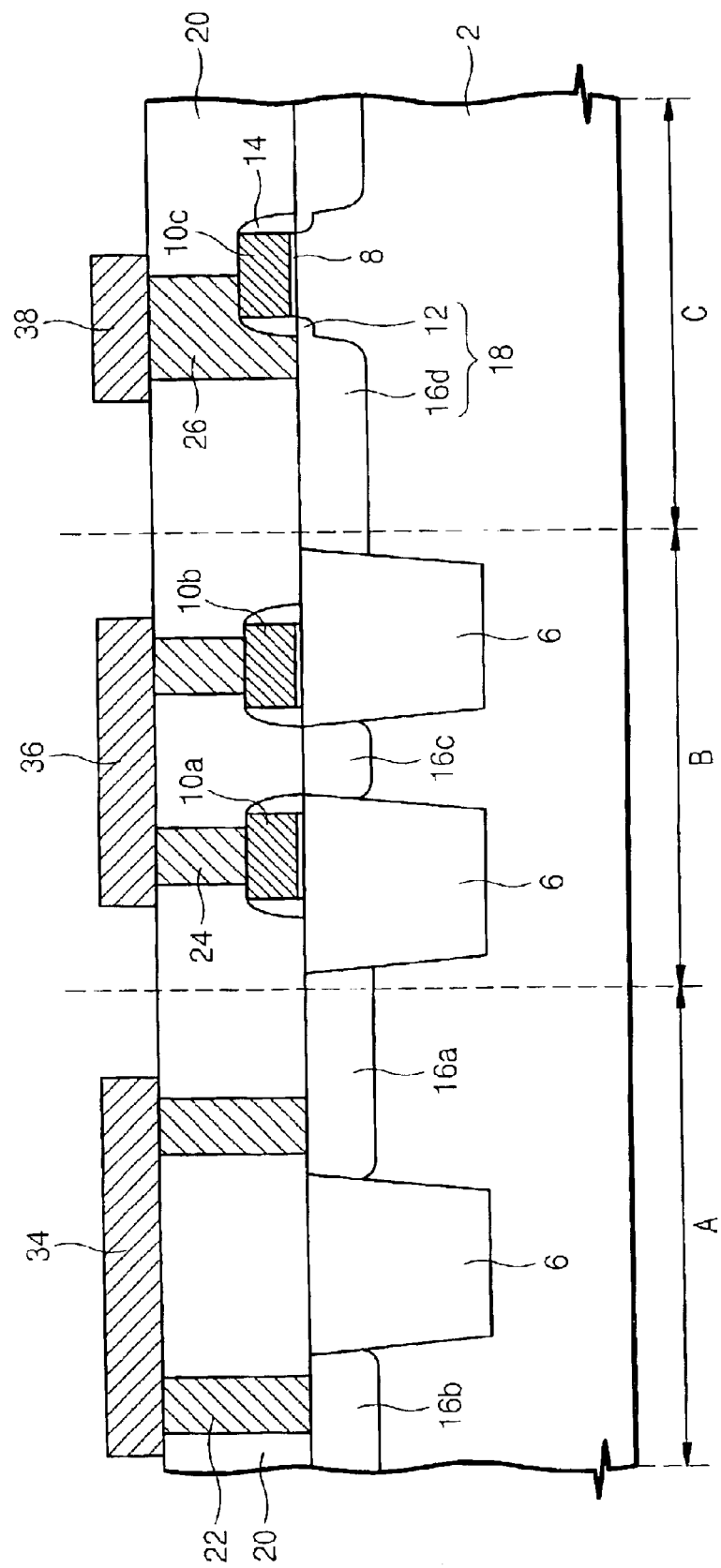
FIGS. 1A and 1B are cross-sectional views illustrating a conventional interconnection structure.
Figure 1B:
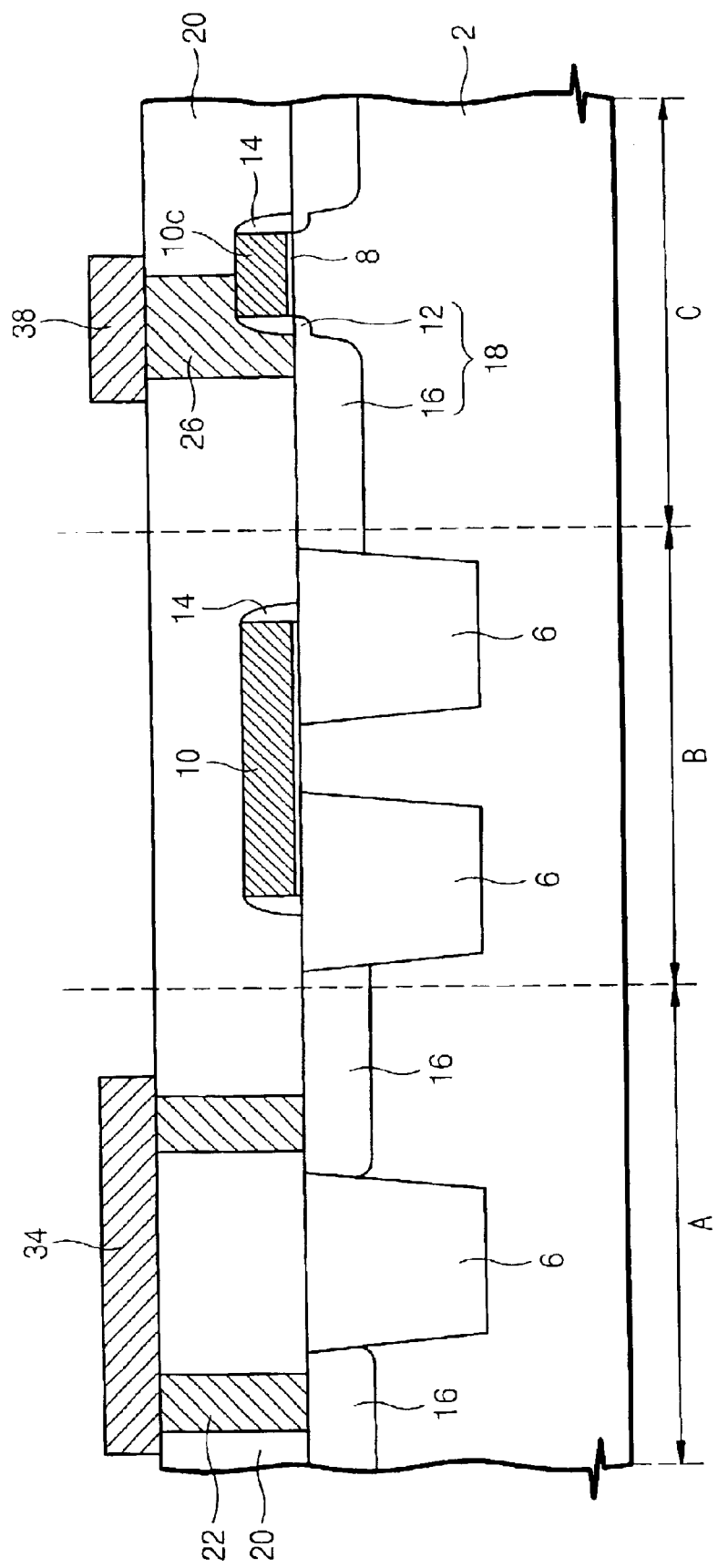

The present invention now will be described more fully hereinafter with reference to the accompanying drawings, in which typical embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the relative sizes of regions may be exaggerated for clarity.

It will be understood that when an element such as a layer, region or substrate is referred to as being "on" another element, it can be directly on the other element or intervening elements may also be present. In contrast, when an element is referred to as being "directly on" another element, there are no intervening elements present.

This disclosure also uses relative terms, such as "under" or "beneath," to describe some of the elements in the embodiments. These relative terms are used for the sake of convenience and clarity when referring to the drawings, but are not to be construed to mean that the elements so described can only be positioned relative to one another as shown. For example, when a first element is described as being under a second element in the viewer's frame of reference, it will be understood that the first element may also be located over the second element, if the embodiment were viewed from a different frame of reference, such as if the entire structure were inverted.

Furthermore, the terms "first," "second," "third," etc. are used for reference only and are not intended as being limiting. For example, in some embodiments a first layer may be a second layer in other embodiments. Thus, the terms "first," "second," "third," etc. are not intended to convey a sequence or other hierarchy to the associated elements but are used for identification purposes only.

Each embodiment described and illustrated herein includes its complementary conductivity type embodiment as well. For example, even though embodiments of NMOS type devices are illustrated and described, the present invention is also applicable to embodiments of PMOS type devices. Terms used herein are to be given their ordinary meaning unless explicitly defined otherwise herein.

Embodiments of the present invention are illustrated with respect to interconnection between two active areas (region D in the Figures), interconnection between two gate electrodes (region E in the Figures) and interconnection between a gate electrode and an active area (region F in the Figures). However, embodiments of the present invention should not be construed as limited to these particular exemplary interconnections or as requiring each of these interconnections.

Figure 2:
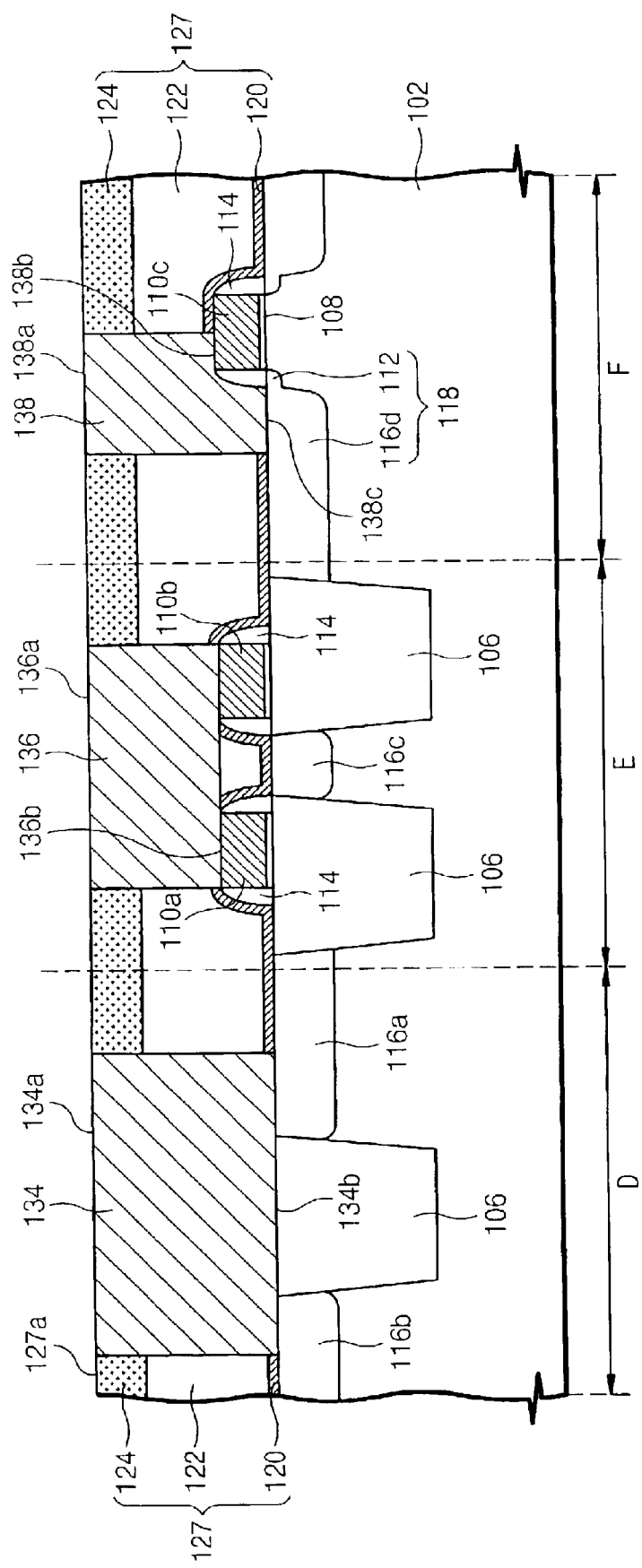
FIG. 2 is a cross-sectional view of an interconnection structure according to embodiments of the present invention.

FIG. 2 is a cross-sectional view illustrating an interconnection in accordance with embodiments of the present invention. As seen in FIG. 2, in region D, a first active region 116a and a second active region 116b (i.e. a doped regions of a substrate 102) are separated by a field area 106. An interlayer dielectric structure 127 includes an etch stop layer 120 on the substrate 102, a lower interlayer dielectric 122 on the etch stop layer 120 and an upper interlayer dielectric 124 on the lower interlayer dielectric 122. A first unitary interconnection structure 134 is disposed in the interlayer dielectric structure 127. The first unitary interconnection structure 134 connects the first active region 116a to the second active region 116b. As seen in FIG. 2, a first surface 134a of the first unitary interconnection structure 134 may be substantially coplanar with a first surface 127a of the interlayer dielectric structure 127 opposite the substrate 102. Furthermore, a second surface 134b of the first unitary interconnection structure 134 may be substantially coplanar with a surface of the first active region 116a and the second active region 116b that it interconnects.

In the region E of FIG. 2, field areas 106 are separated by a third active region 116c. A first conductive line 110a and a second conductive line 110b are disposed on each field area 106. The first and second conductive lines 110a and 110b cross a field area and an active area in a third dimension so as to provide electrodes that cover the active region. An interlayer dielectric structure 127 includes an etch stop layer 120 on the substrate 102, a lower interlayer dielectric 122 on the etch stop layer 120 and an upper interlayer dielectric 124 on the lower interlayer dielectric 122. A second unitary interconnection structure 136 connects the first conductive line 110a to the second conductive line 110b and is disposed in the interlayer dielectric structure 127. The interlayer dielectric structure 127 may also be provided on the spacers 114 as well as the first and second conductive lines 110a and 140b. An interlayer dielectric structure including sidewall spacers 114, an etch stop layer 120 and a lower interlayer dielectric 122 are interposed in a gap between the first and the second conductive lines 110a and 110b to electrically insulate the third active region 116c from the first and second conductive lines 110a and 110b. As seen in FIG. 2, a first surface 136a of the second unitary interconnection structure 136 may be substantially coplanar with a first surface 127a of the interlayer dielectric structure 127 opposite the substrate 102. Furthermore, a second surface 136b of the second unitary interconnection structure 136 may be substantially coplanar with a surface of the first conductive line 110a and the second conductive line 110b that it interconnects.

A MOS-transistor comprising a gate structure and an active region 118 is illustrated in region F of FIG. 2. The gate structure is provided on the substrate 102 and the active regions 118 are doped regions at both sidewalls of the gate structure. The gate structure includes a gate electrode 110c having a gate insulator 108 and sidewall spacers 114 formed on the sidewalls of the gate electrode 110c. The active region 118 doped with impurities provides a source/drain area and includes a lightly doped region 112 and heavily doped region 116d. The interlayer dielectric structure 127 includes an etch stop layer 120 on the substrate 102, a lower interlayer dielectric 122 on the etch stop layer 120 and an upper interlayer dielectric 124 on the lower interlayer dielectric 122. A third unitary interconnection structure 138 is disposed in the interlayer dielectric structure 127, which electrically connects a top surface of the gate electrode 110c to the active region 118. As seen in FIG. 2, a first surface 138a of the second unitary interconnection structure 138 may be substantially coplanar with a first surface 127a of the interlayer dielectric structure 127 opposite the substrate 102. Furthermore, a second surface 138b of the second unitary interconnection structure 138 may be substantially coplanar with a surface of the gate electrode 110c and a third surface 138c of the third unitary interconnection structure 138 may be substantially coplanar with a surface of the active region 116d that it interconnects.

Fabrication of interconnection structures according to embodiments of the present invention is described below with reference to FIGS. 3–10. FIGS. 3 through 7 are cross-sectional views illustrating fabrication methods according to particular embodiments of the present invention embodiment of the present invention.

Figure 3:
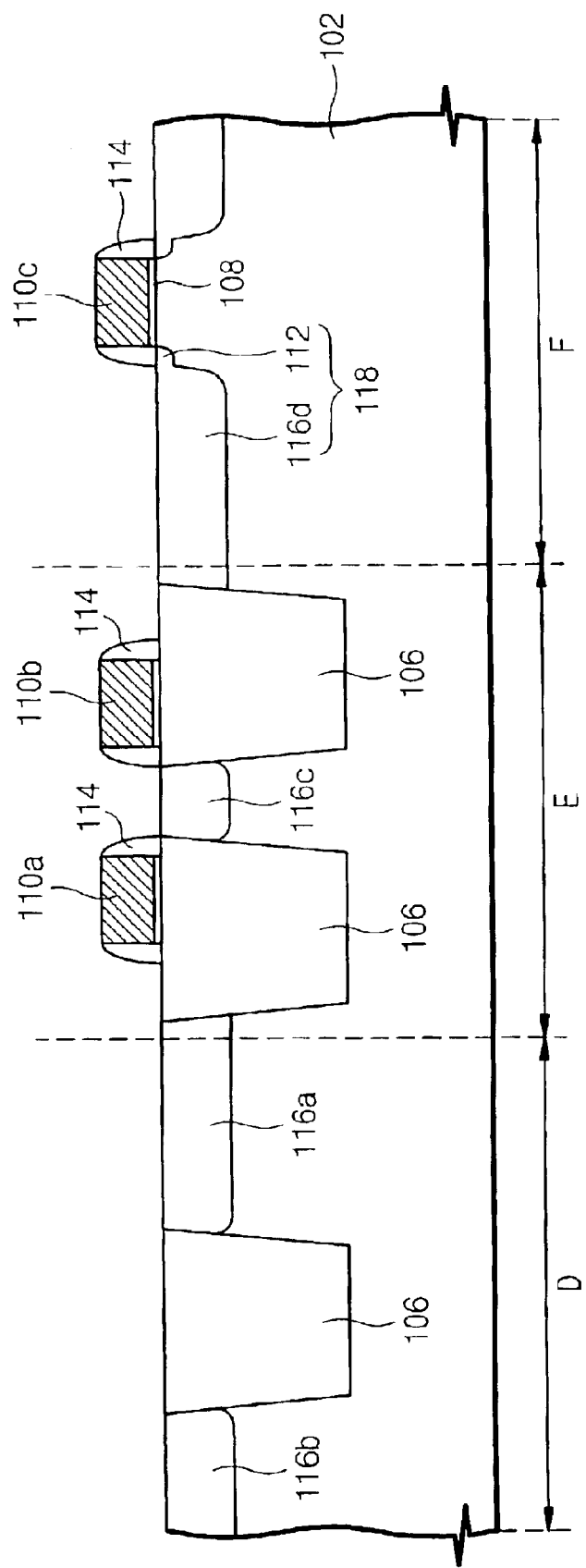
FIGS. 3 through 7 are cross sectional views illustrating fabrication of an interconnection structure according to embodiments of the present invention.

Referring to FIG. 3, a field area 106 defining a first active region 116a, a second active region 116b, a third active region 116c, and the fourth active region 116d is formed in substrate 102. For example, the substrate 102 maybe selectively etched to form a trench and the trench is filled with dielectric material(s). The field area 106 is the formed by a chemical mechanical polishing process (CMP).

A gate insulator layer is formed on the substrate 102 and a first conductive layer is formed on the gate insulator layer. The gate insulator layer and the first conductive layer are successively patterned by conventional photolithography. In particular, a first conductive line 110a and a second conductive line 110b are formed on each portion of the field area 106 at opposite sides of the third active region 110b in region E. A gate electrode 110c with a gate insulator 108 is formed in region F. The first conductive layer may be, for example, polysilicon, silicide and/or tungsten. Thereafter an impurity area 112 is formed using the gate electrode 110c and the field area 106 as ion implantation masks. A spacer insulator is formed on a surface of the substrate 102 and then anisotropically etched to form the first conductive line 110a, the second conductive line 110b, and spacers 114 on the sidewalls of the gate electrode 110c and the first and second conductive lines 110a and 110b. Heavily doped active regions 116a, 116b, 116c and 116d are formed using the gate electrode 110c, the spacers 114 and the field area 106 as an ion implantation mask. The lightly doped impurity region 112 and the active region 116d, that is doped with a higher density of impurities, provide source/drain regions of a MOS-transistor.

Figure 4:
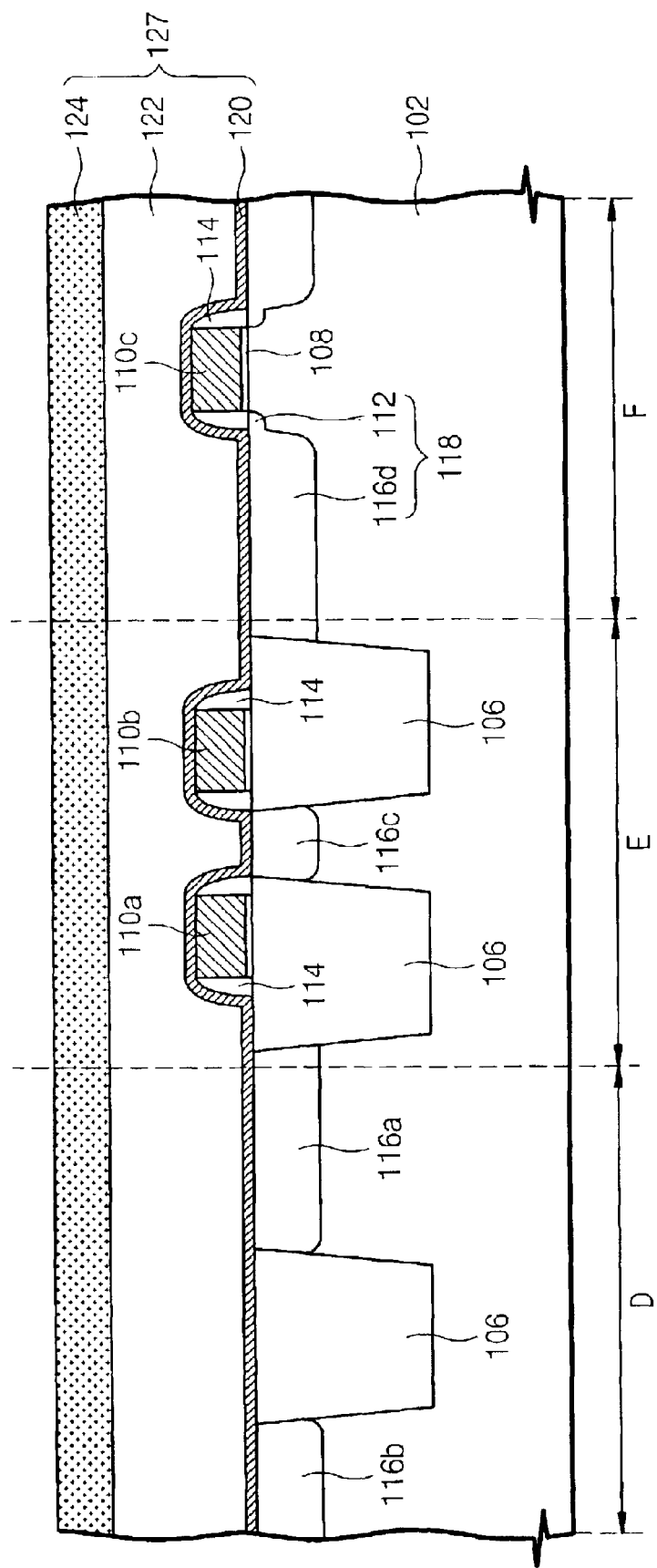

Referring to FIG. 4, an interlayer dielectric structure 127 including an etch stop layer 120 on the substrate 102, a lower interlayer dielectric 122 on the etch stop layer 120 and an upper interlayer dielectric 124 on the lower interlayer dielectric layer 122 is deposited on a surface of the substrate. In particular embodiments of the present invention, the lower interlayer dielectric 122 is made of materials having a different etch selectivity with respect to the etch stop layer 120 and the upper interlayer dielectric 124. The upper interlayer dielectric 124 may serve as an anti-reflecting layer or a hard mask layer.

Figure 5:
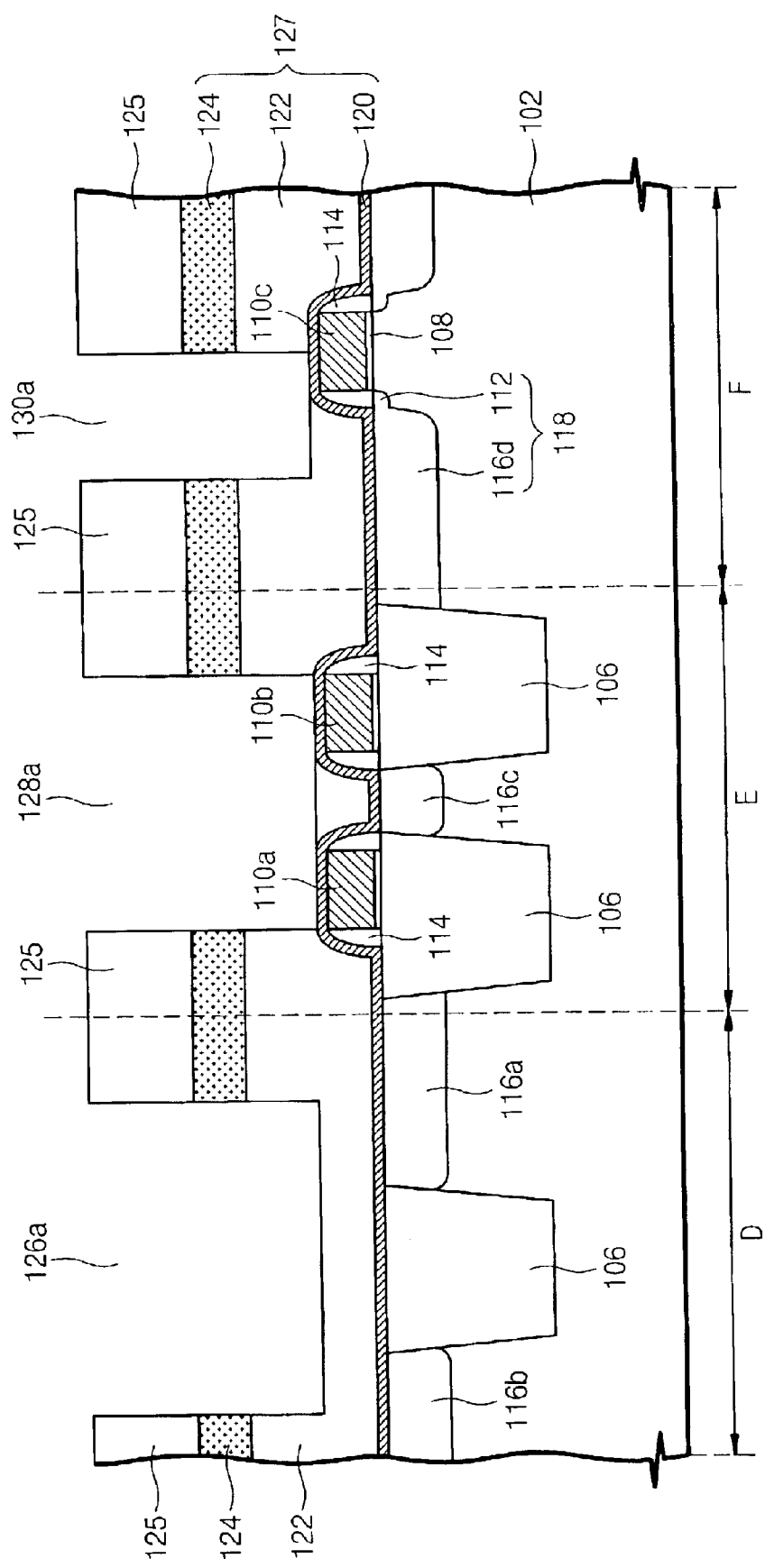

Referring to FIG. 5, a photoresist pattern 125 is formed by a conventional photolithography process. The upper interlayer dielectric 124 and the lower interlayer dielectric 122 are etched until the etch stop layer 120 formed on top surfaces of the first conductive line 110a, the second conductive line 110b and the gate electrode 110c is exposed to form openings 126A, 128a and 130a using the photoresist pattern 125 as an etch mask. A portion of the lower interlayer dielectric 122 remains at bottoms of the openings 126a and 130a of the regions D and F. A portion of the lower interlayer dielectric 122 also remains in a gap between conductive lines 110a and 110b at the bottom of the opening 128a in the region E.

Figure 6:
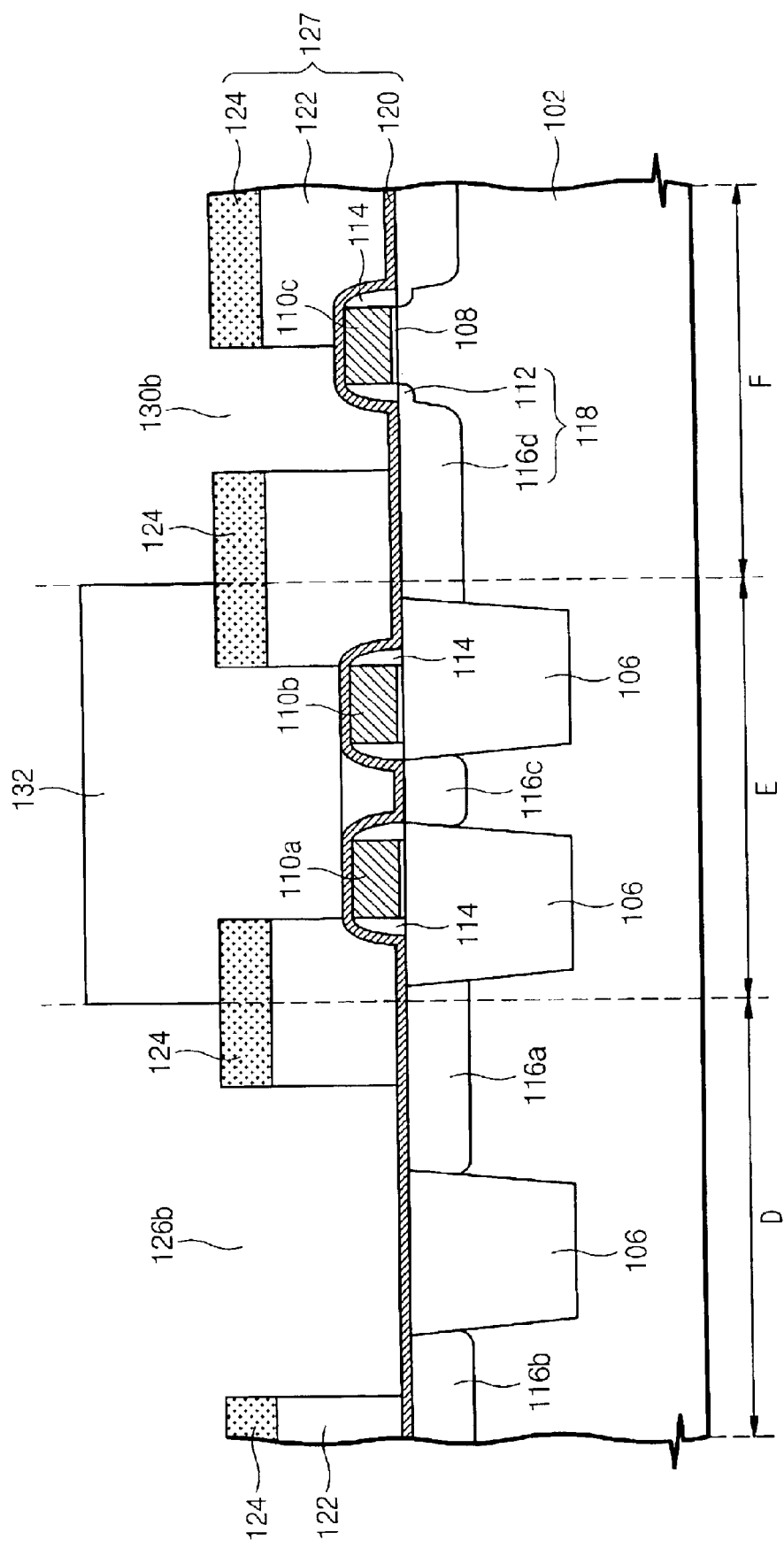

Referring to FIG. 6, a mask pattern 132 is formed, which covers sufficiently the opening 128a (FIG. 5) of the region E utilizing a conventional photolithography process. The lower interlayer dielectric 122 is etched using the mask pattern 132 and the upper interlayer dielectric 124 as an etching mask to form openings 126b and 130b exposing a surface of the etch stop layer 120 in the regions D and F.

Figure 7:
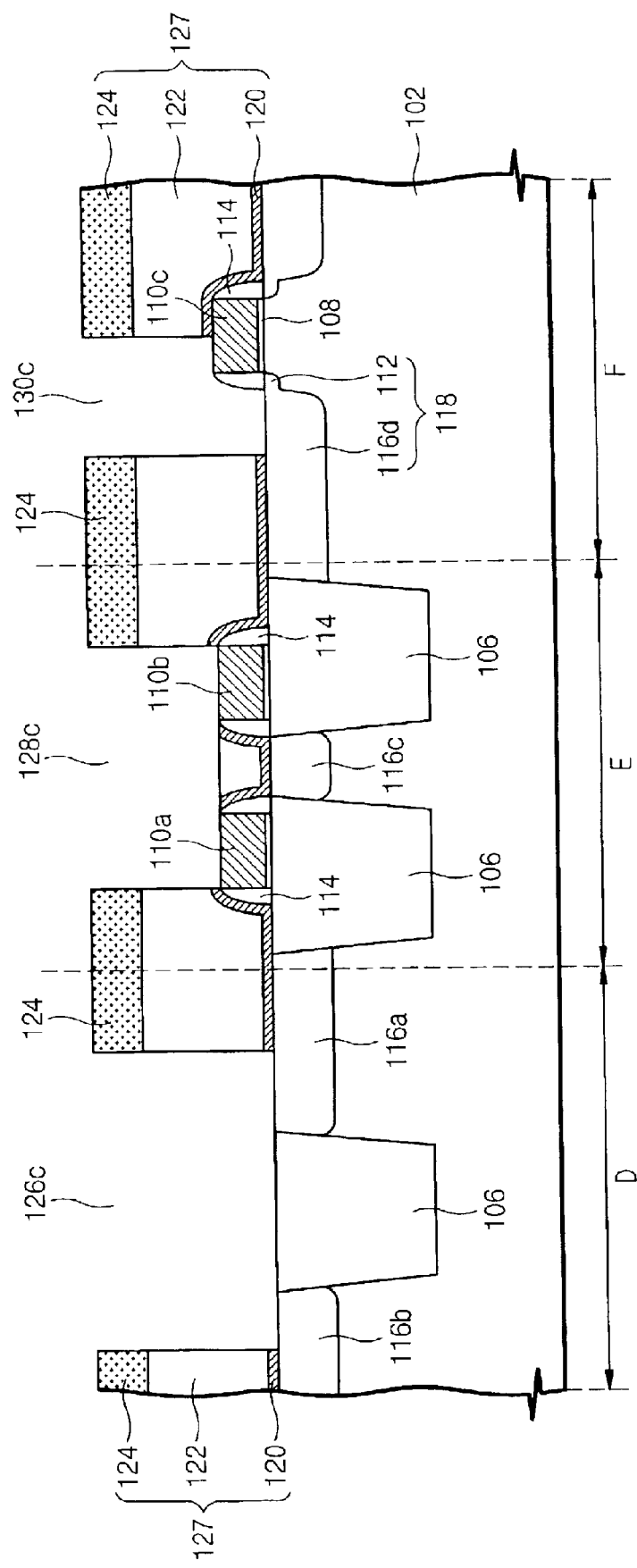

Referring to FIG. 7, the mask pattern 132 is removed and then the exposed etch stop layer 120 is etched using the upper interlayer dielectric 124 as an etching mask. Thus, the portion of the field area 106 between the first active area 116a and the second active area 116b and portions of the first active area 116a and the second active area 116b are exposed in the opening 126c of the region D. Top surfaces of the first and the second conductive lines 110a, 110b, and an interlayer dielectric remaining in the gap therebetween are exposed in the opening 128c of the region E. A top surface of a gate electrode 110 and the fourth active region 116d are exposed in an opening 130c of the region F.

Referring to FIG. 2, a damascene process is used to from the conductors. In particular, a second conductive layer is formed to sufficiently fill the openings 126c, 128c and 130c and then the second conductive layer is planarized until the upper interlayer dielectric 124 is exposed. The second conductive layer may be tungsten, aluminum, copper, titanium, titanium nitride, and/or tantalum nitride. Planarizing may be performed by a CMP process or an etch back process. Thus, a unitary interconnection structure 134 connecting the first active region 116a to the second active region 116b is formed in the region D through the planarization process. An interconnection structure 136 connecting the first conductive line 110a to the second conductive line 110b is formed in the region E and an interconnection structure 138 connecting the gate electrode 110c to the fourth active region 116d is formed in the region F through the planarization process.

Figure 8:
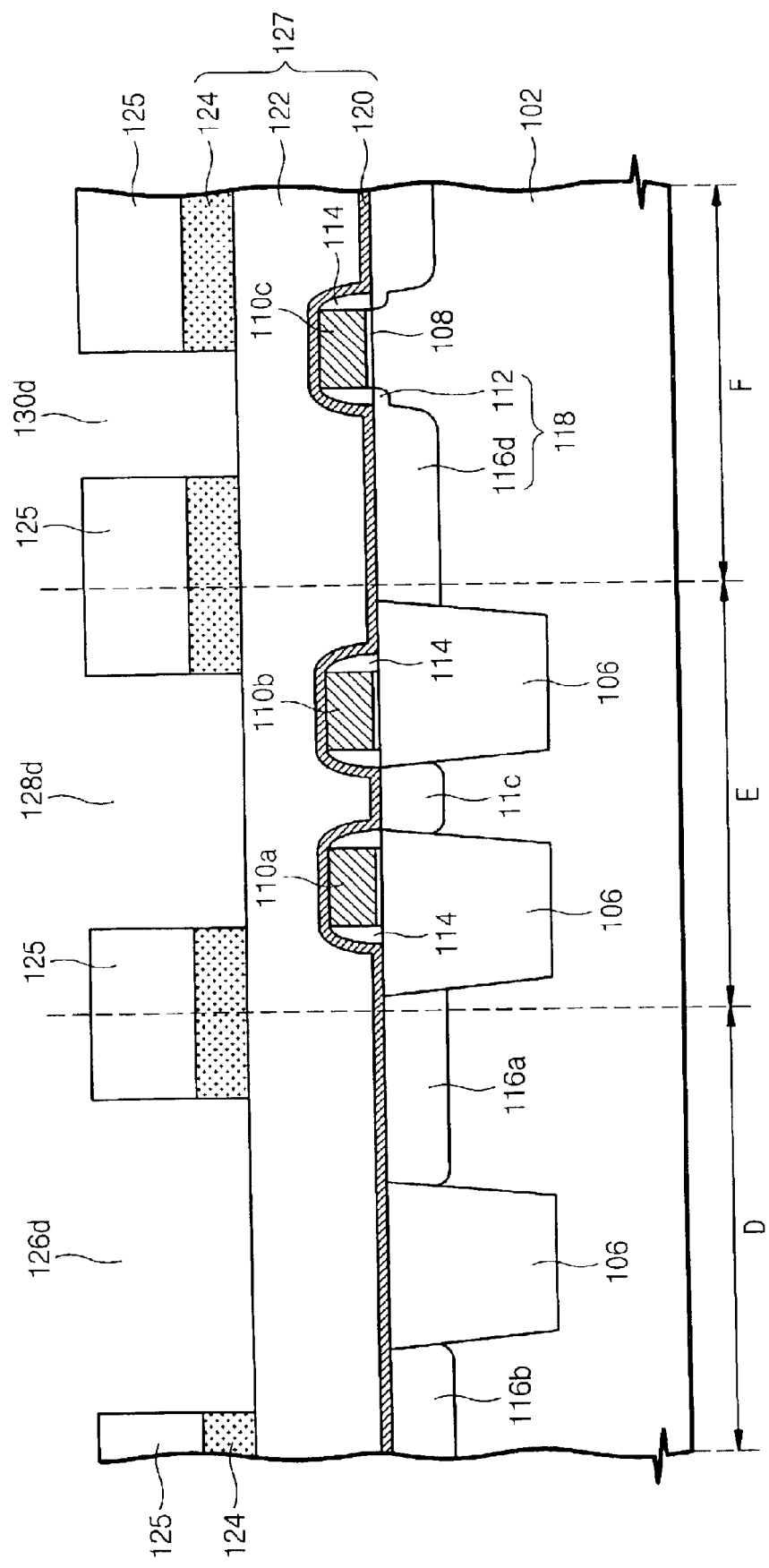
FIGS. 8 through 10 are cross sectional views illustrating a fabrication method of an interconnection structure according to further embodiments of the present invention.
Figure 9:
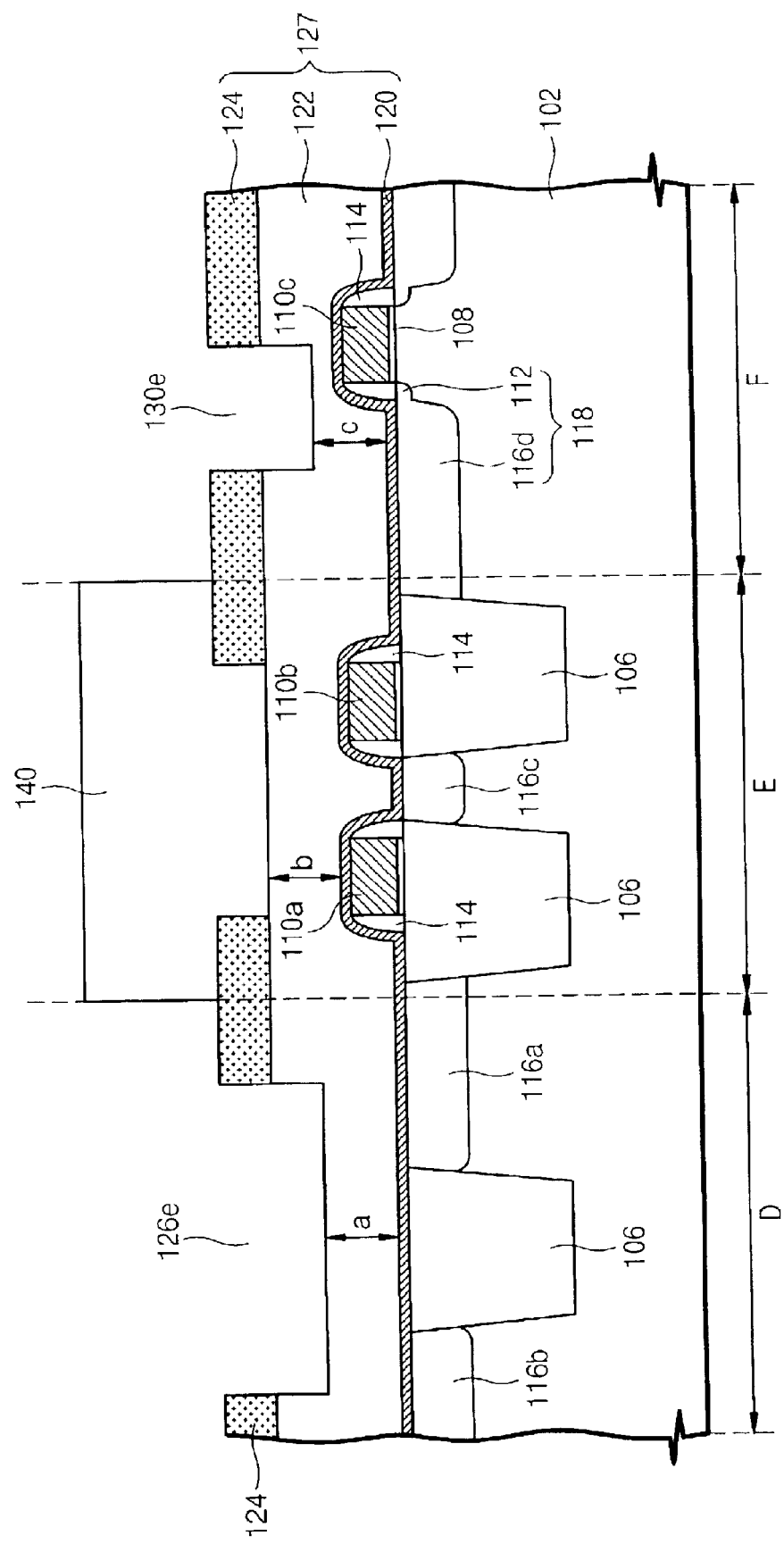
Figure 10:
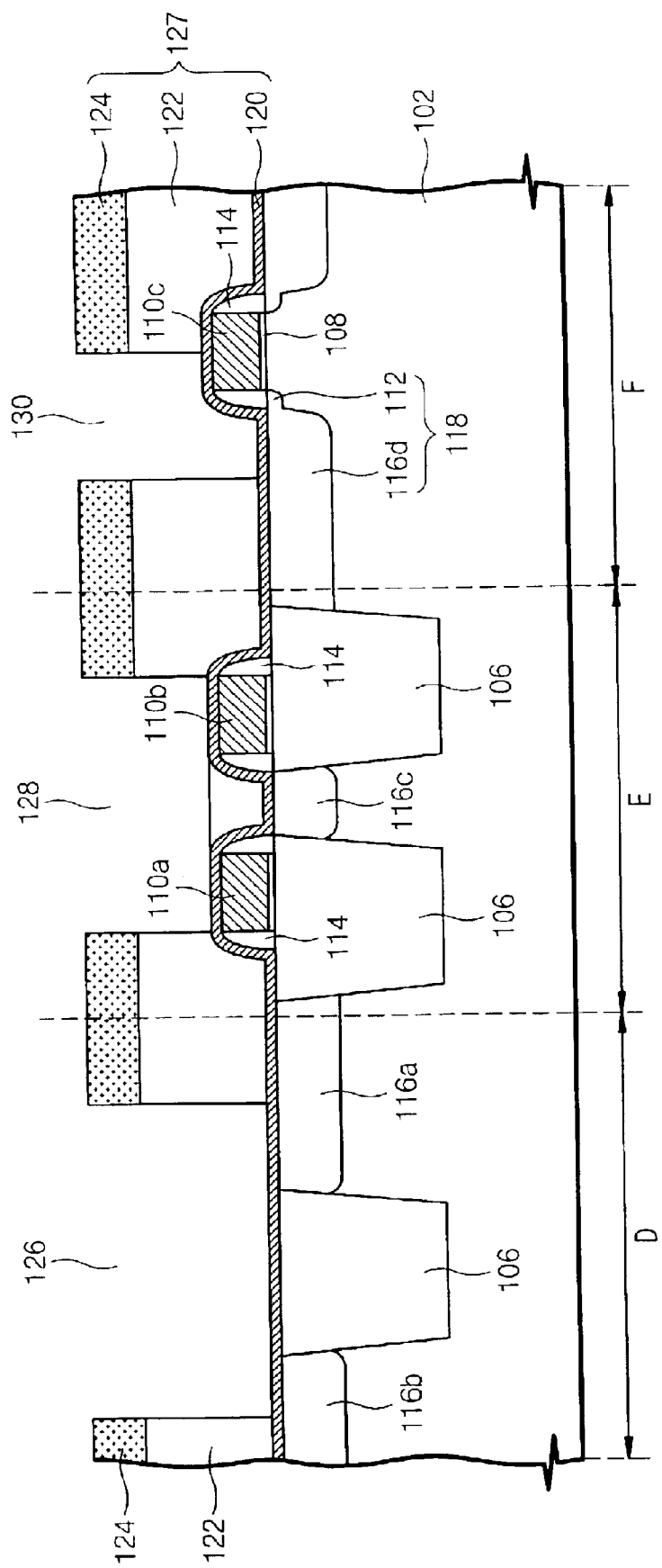

FIGS. 8 through 10 are cross-sectional views illustrating fabrication methods of interconnection structure according to further embodiments of the present invention. The fabrication steps of FIGS. 3 and 4 are carried out as described above. Furthermore, the formation of the photoresist pattern 125 on the interlayer dielectric 127 is also carried out as described above with reference to FIG. 5.

Referring to FIG. 8, the upper interlayer dielectric 124 is selectively etched until a surface of the lower interlayer dielectric 122 is exposed using the photoresist pattern 125 as an etching mask to form openings 126d, 128d and 130d.

Referring to FIG. 9, the photoresist pattern 125 is removed and then a conventional photolithography process forms a mask pattern 140 sufficiently covering opening 128d. Thereafter, using the mask pattern 140 and the upper interlayer dielectric 124 as an etching mask, a portion of the exposed lower inter-layer dielectric 122 is selectively etched in the regions D and F. As a result, the difference in thickness between the thickness b of the lower interlayer dielectric 122 formed on the conductive lines 110a and 110b at the bottom of the opening 128d of the region E and the thicknesses a and c of a lower interlayer dielectric 122 formed on the substrate 102 at the bottom of the openings 126e and 130e of the regions D and F is reduced.

Referring to FIG. 10, the photoresist pattern 140 is removed and the lower interlayer dielectric 122 is etched using the upper interlayer dielectric 124 as an etching mask to form openings 126b, 128a and 130b exposing a surface of the etch stop layer 120. The spacers 114, the etch stop layer 120 and the lower interlayer dielectric 122 remain in the gap between the conductive lines 110a and 110b in the region E because the thickness of the etched lower interlayer dielectric 122 is substantially uniform prior to the etching operation illustrated in FIG. 10.

Referring to FIG. 2 again, the etch stop layer 120 exposed at the bottom of the openings 126b, 128a and 130b is removed and the openings are filled with a second conductive layer that is then planarized to form unitary interconnection structures 134, 136, and 138.

An interconnection structure of the mentioned exemplary embodiments of the present invention may connect an active region to an active region, a conductive line to a conductive line and/or a gate electrode to an active region and the connections are formed at the same time and of the same materials by a damascene process. According to certain embodiments of the present invention, the unitary interconnection structures of regions D, E and F are simultaneously formed. However, according to additional embodiments of the present invention, each interconnection of regions D and E, each interconnection of only regions E and F, or each interconnection of regions D and F may be formed at the same time, respectively.

Figure 11:
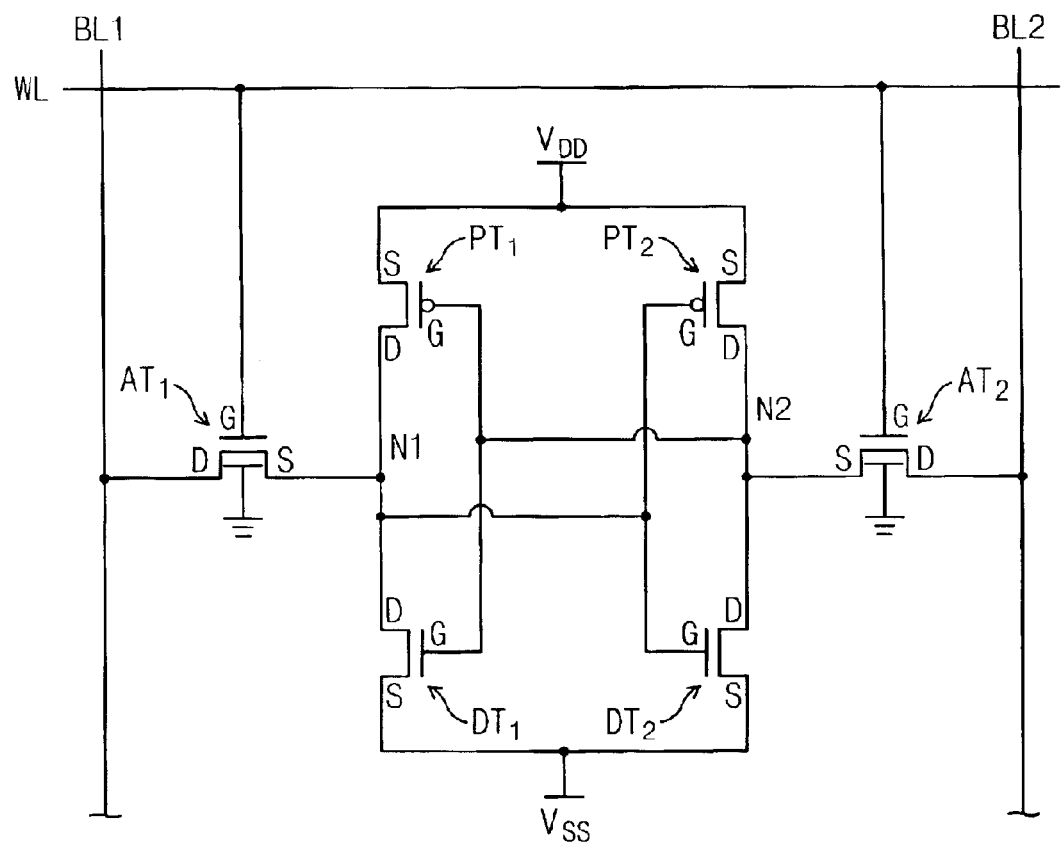
FIG. 11 is a circuit diagram of an SRAM cell.

These interconnections may be used in various kinds of fabrication processes of semiconductor devices. According to certain embodiments of the present invention, a fabrication method of the interconnection structure is utilizing in the fabrication of a static random access memory (SRAM). Such an SRAM and fabrication is described herein with respect to FIGS. 11 through 16. In the SRAM illustrated in FIGS. 11 through 16, the fabrication of the unitary interconnection structures of regions D and E is provided at the same time. FIG. 11 is a circuit diagram of SRAM cells. FIGS. 12 through 16 are views illustrating two SRAM cells using the interconnection structure according to certain embodiments of the present invention.

Referring to FIG. 11, and SRAM cell includes two access transistors AT1 and AT2, two pull-up transistors PT1 and PT2 and two drive transistor DT1 and DT2. Transistors PT1 and DT1 constitute a first inverter and transistors PT2 and DT2 constitute a second inverter. The first and second inverters cross each other at nodes N1 and N2, respectively. Source regions of the transistors DT1 and DT2 are connected to a ground line $V_{SS}$ and source regions of the transistors PT1 and PT2 are connected to a power line $V_{DD}$. A drain of the transistor AT1 is connected to a bit line BL1 and a drain of transistor AT2 is connected to a bit line BL2. Each source of the transistor AT1 and the transistor AT2 is connected to node N1 and node N2, respectively. Gate electrodes of the transistors AT1 and AT2 are connected to a common word line (WL).

Figure 12:
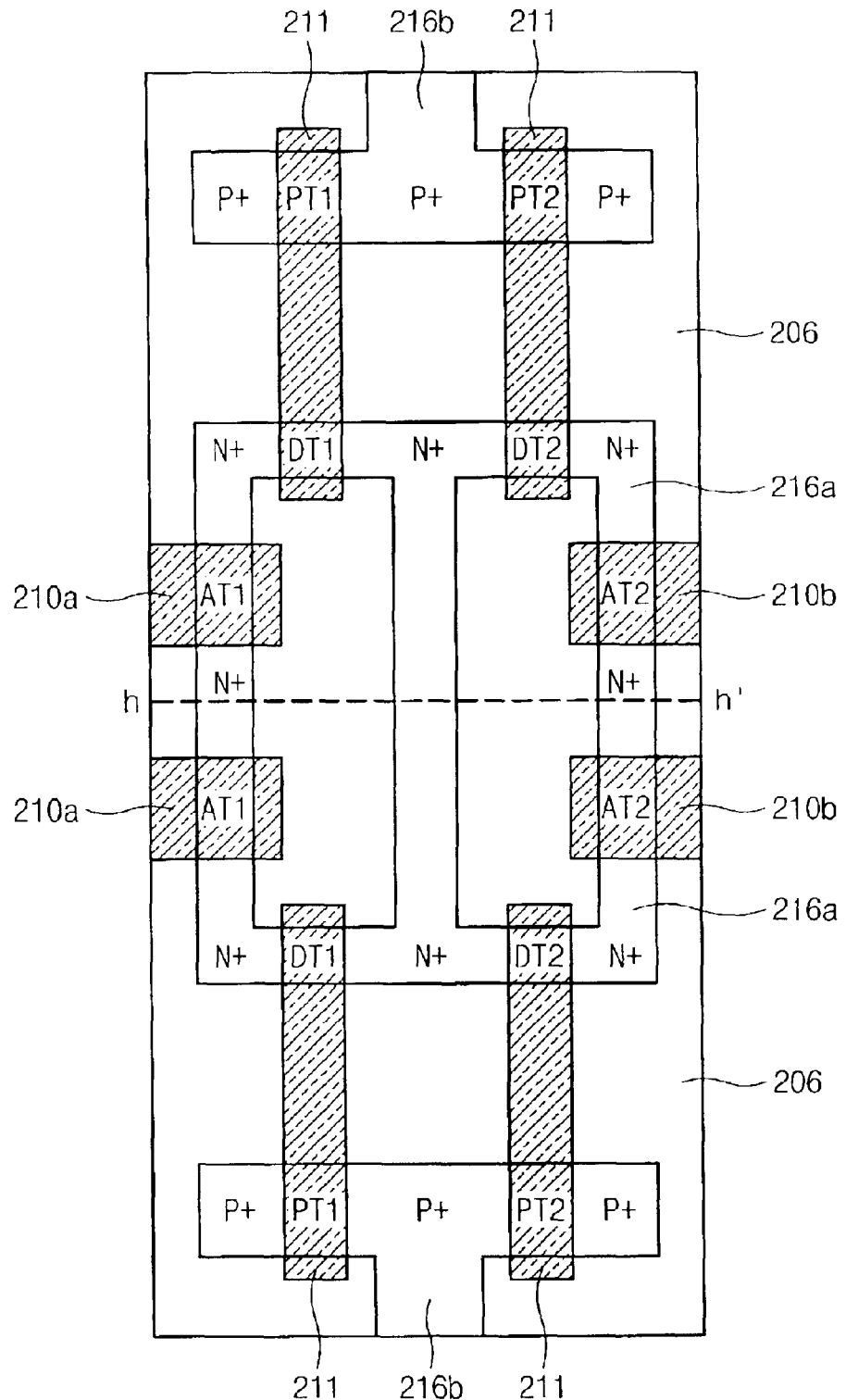
FIGS. 12 through 16 illustrate two SRAM cells incorporating an Interconnection structure according to embodiments of the present invention.
Figure 13:
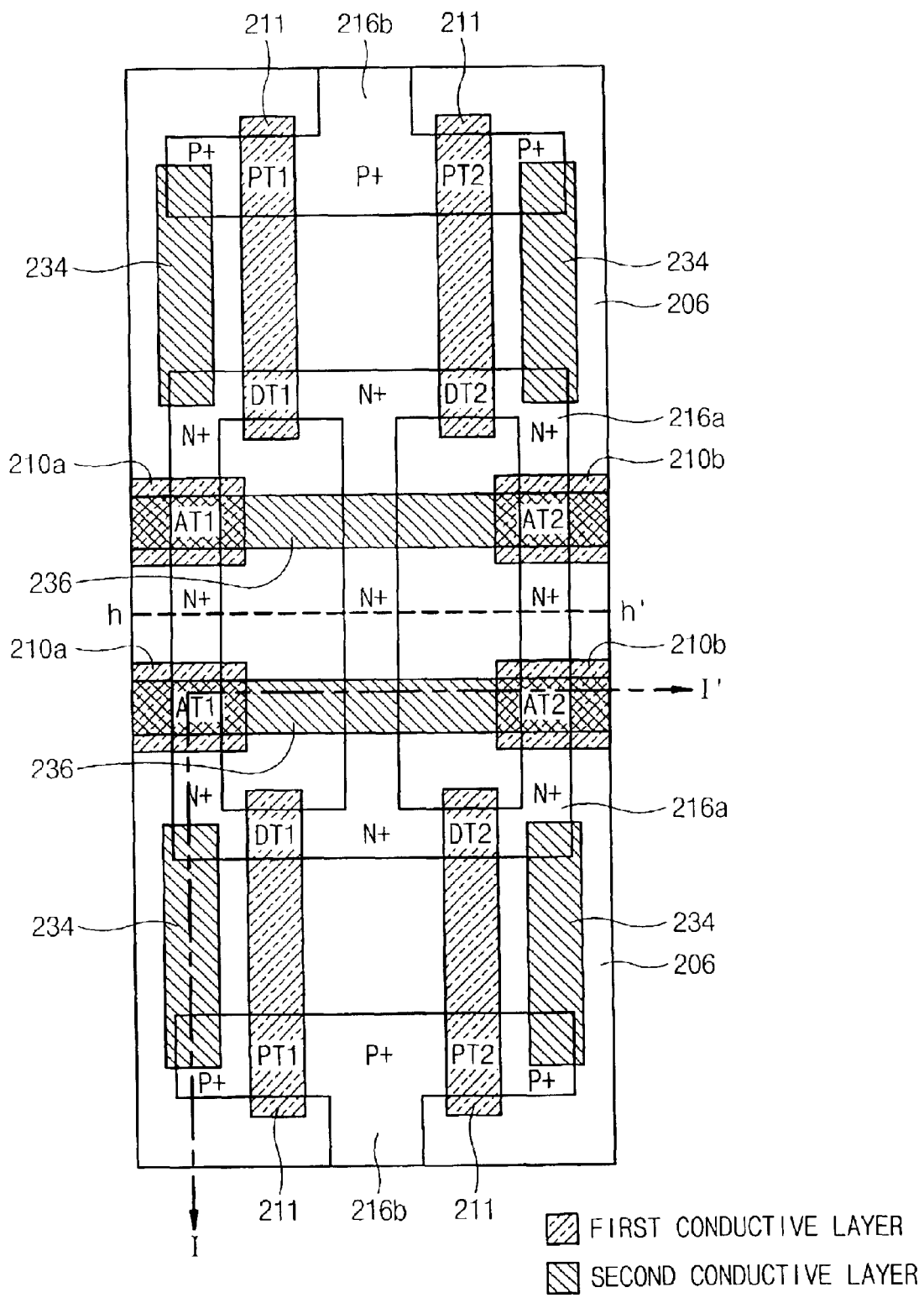

FIGS. 12 and 13 are top plan views illustrating two symmetrical virtual mirror SRAM cells along a central line h–h'. Referring to FIG. 12, a field area 206 defines active regions 216a and 216b. The active regions comprise a first active region 216a where an N-type transistor is formed and a second active region 216b where a P-type transistor is formed.

The conductive layers 210a and 210b cross over the active regions 216a, 216b, and the field area 206. The first conductive layer constitutes first gate electrodes 210a and 210b and second electrodes 211. Two first electrodes and two second electrodes are disposed in each cell. The two first gate electrodes 210a and 210b constitute gates of a transistor AT1 and a transistor AT2, respectively, and cross the first active region 216a.

One of the second gate electrodes 211 is disposed perpendicular to the first gate electrodes 210a and 210b and crosses a top portion of the active regions 216a and 216b to form a gate electrode of the transistor DT1 and transistor PT1. One of the gate electrodes 211 also connects the gate electrodes of the transistor DT1 and the transistor PT1.

Impurities are doped in the active regions 216a and 216b among the first conductive layers 210a, 210b and 211. A heavily doped active region (shown as N+) with n-type impurities is formed at the first active region 216a. A heavily doped active region (shown as P+) with p-type impurities is formed at the second active region 216b.

FIG. 13 is a top plan view illustrating a second conductive layer 234 and 236 on the structure of FIG. 12. Referring to FIG. 13, the second conductive layer comprises word lines 236 connecting the first gate electrodes 210a and 210b and an unitary interconnection structure 234 connecting the active region 216a doped with n-type impurities to an active region 216b doped with p-type impurities.

Figure 14:
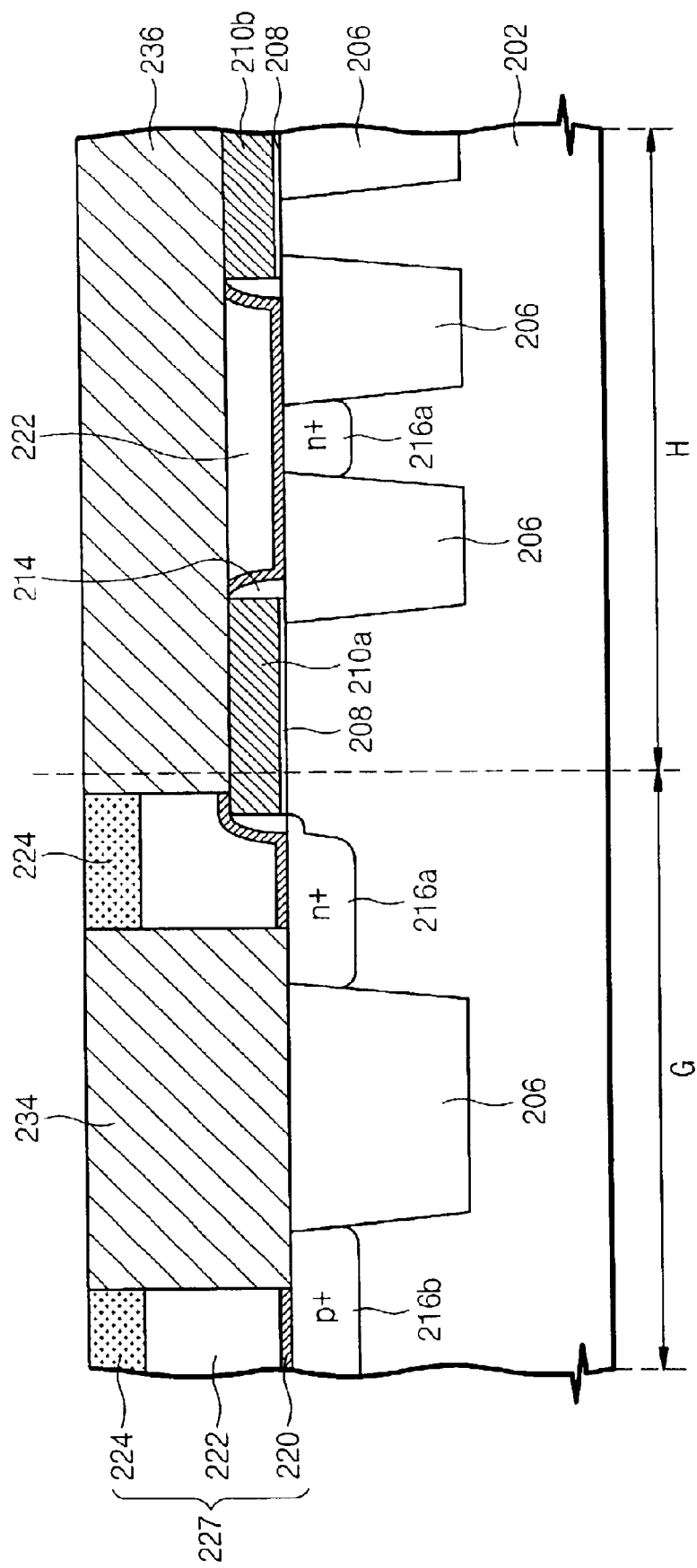

FIG. 14 is a cross-sectional view taken along a line I–I' of FIG. 13 illustrating a unitary interconnection structure 234 connecting an active region 216a doped with n-type impurities to an active region 216b doped with p-type impurities in the region G and also illustrating a word line 236 connecting the gate electrode 210a to the gate electrode 210b in the region H.

Referring to FIGS. 13 and 14, an active region 216a doped with n-type impurities and an active region 216b doped with p-type impurities are disposed at each side of a field area 206 in the region G of the substrate 202. An etch stop layer 220 is provided on the substrate 202, a lower interlayer dielectric 222 is provided on the etch stop layer 220 and an upper interlayer dielectric 224 is provided on the lower interlayer dielectric 222 to provide an interlayer dielectric structure 227. A unitary interconnection structure 234 is formed by a damascene process and is disposed in the interlayer dielectric structure 227 to electrically connect the active region 216a doped with n-type impurities to the active region 216b doped with p-type impurities.

As is further illustrated in FIGS. 13 and 14, a field area 206 defines an active region in the region H of the substrate 202. Gate electrodes 210a and 210b crossing the active region and the field area are separated a predetermined distance. A dielectric structure comprising spacers 214, an etch stop layer 220, and a lower interlayer dielectric 222 is interposed in a gap between the gate electrode 210a and 210b. The gate electrodes 210a, 210b and the dielectric structure intervening therebetween are aligned parallel. A word line 236 is disposed on top surfaces of the gate electrodes 210a and 210b to electrically connect the gate electrodes 210a and 210b. The lower interlayer dielectric 222 and an active region 216a doped with n-type impurities are disposed at the substrate 202 under the word line 236. The active region 216a perpendicularly crosses the word line 236. The lower interlayer dielectric 222 and the etch stop layer 220 are interposed between the word line 236 and the active region 216a. The active region 216a doped with n-type impurities and the word line 236 cross each other and each may serve as a conductive line.

The unitary interconnection structure 234 of the region G and the word line 236 of the region H are formed with dielectric structures 227 including a lower interlayer dielectric 222, and an upper interlayer dielectric 224 by a damascene process. The interconnection structures 234 and 236 may be formed as described above.

An SRAM cell as illustrated in FIGS. 13 and 14 may be highly integrated may utilize a simplified fabrication process. For example, the active region 216a doped with n-type impurities and the word line 236 which cross each other may provide a conductive line to form a common ground line 244 of the two cells as shown in FIG. 15.

Figure 15:
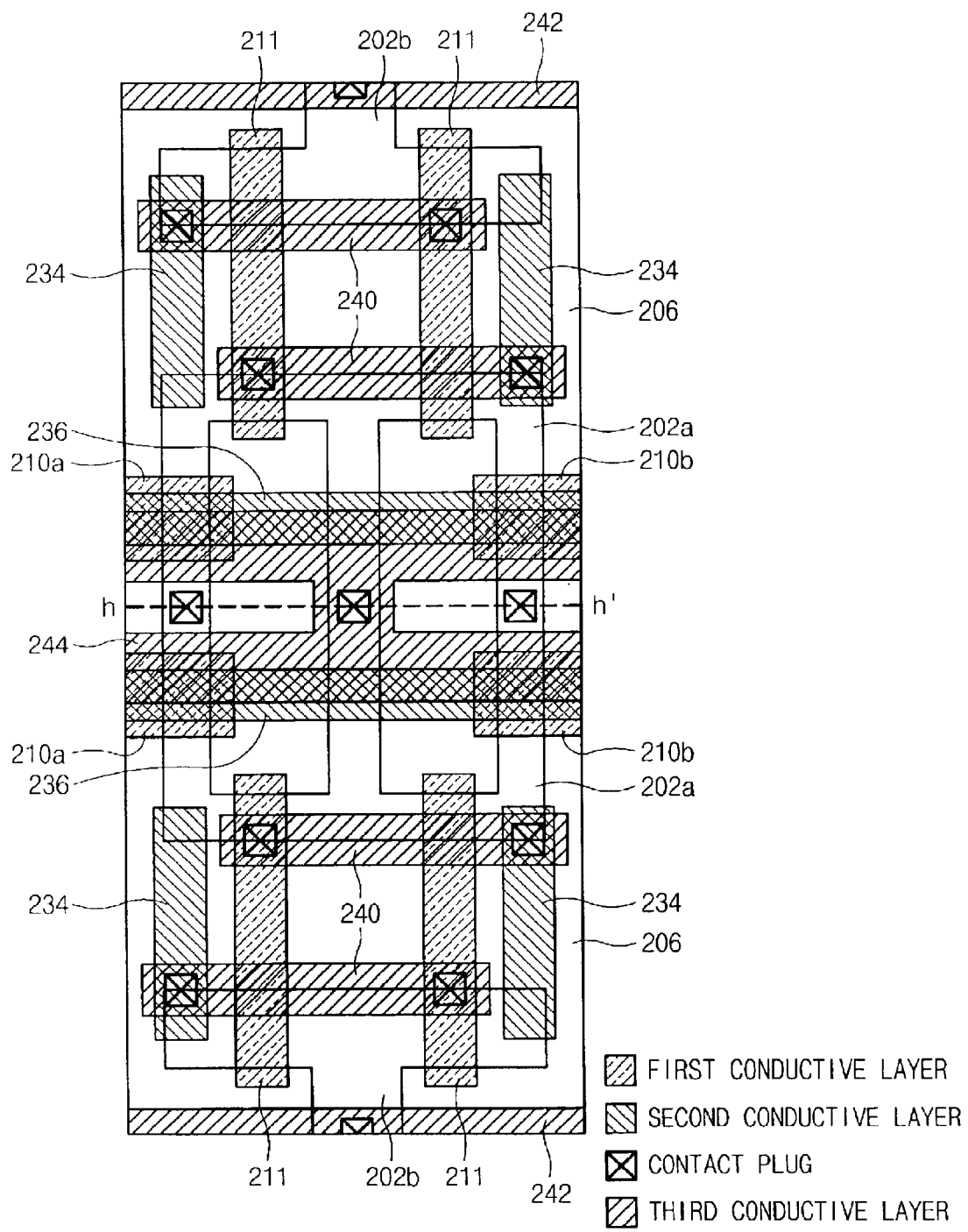

FIG. 15 is a top plan view illustrating a third conductive layer on the structure illustrated in FIG. 13. Referring to FIG. 15, the third conductive layers 240, 242, and 244 include a local interconnection 240, a power line 242 and a common ground line 244 and electrically connect otherwise isolated regions through each contact.

Figure 16:
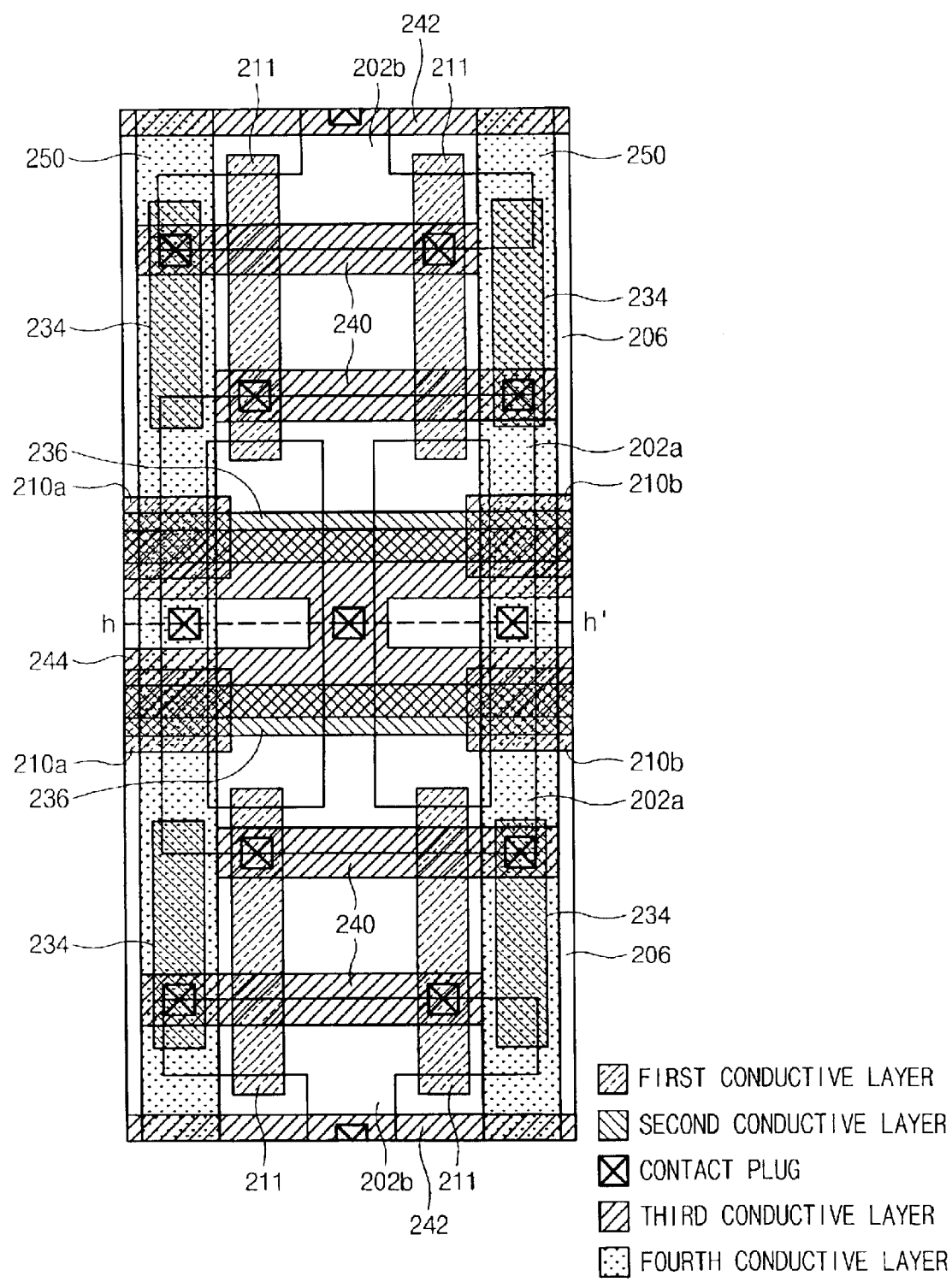

FIG. 16 is a top plan view illustrating a fourth conductive layer on the structure illustrated in FIG. 15. Referring to FIG. 16, the fourth conductive layer 250 provides a bitline and is connected to an active region doped with n-type impurities through a contact.

The present invention may be embodied in different forms and should not be constructed as limited to the embodiments set forth herein. Rather, these embodiments are provided so that this disclosure will be thorough and complete, and will fully convey the scope of the invention to those skilled in the art.

Particular embodiments of the present invention can simplify the fabrication process by forming an interconnection structure with identical materials between active regions, between conductive lines, and between a gate electrode and an active region. In addition, each word line can be used as a conductive line though a word line crosses a doped active region, because an interlayer dielectric is interposed between the active region and the word line.

What is claimed is:

1. An interconnection structure of a semiconductor device comprising:
   a first active region in a substrate;
   a second active region in the substrate;
   a first field region in the substrate disposed between the first active region and the second active region;
   an interlayer dielectric on the substrate; and
   a first unitary interconnection structure contacting and electrically connecting the first active region and the second active region, the first unitary interconnection structure being disposed in the interlayer dielectric but does not extend onto a surface of the interlayer dielectric opposite the substrate.

2. The interconnection structure of claim 1, wherein the first active region and the second active region have a surface substantially coplanar with a surface of the substrate and wherein the first unitary interconnection structure has a first surface that is substantially coplanar with the surface of the substrate and a second surface, opposite the first surface, that is substantially coplanar with the surface of the interlayer dielectric opposite the surface of the substrate.

3. The interconnection structure of claim 1, wherein the interlayer dielectric comprises:
   an etch stop layer on the substrate;
   a first dielectric layer on the etch stop layer; and
   a second dielectric layer on the first dielectric layer opposite the etch stop layer.

4. The interconnection structure of claim 3, wherein the first dielectric layer and the second dielectric layer have different etch rates with respect to each other.

5. The interconnection structure of claim 1, wherein the first unitary interconnection structure is a material selected form the group consisting of tungsten, aluminum, copper, titanium, titanium nitride and tantalum nitride.

6. An interconnection structure of a semiconductor device comprising:
   a first active region in a substrate;
   a second active region in the substrate;
   a first field region in the substrate disposed between the first active region and the second active region;
   an interlayer dielectric on the substrate;
   a first unitary interconnection structure contacting and electrically connecting the first active region and the second active region, the first unitary interconnection structure being disposed in the interlayer dielectric;
   a third active region in the substrate;
   second and third field areas in the substrate and on opposite sides of the third active region;
   a first conductive line on the second field area;

a second conductive line on the third field area;

a second unitary interconnection structure contacting the first conductive line and the second conductive line and electrically connecting the first conductive line to the second conductive line, the second unitary interconnection structure being disposed in the interlayer dielectric; and wherein a portion of the interlayer dielectric is disposed on the third active region and in a gap between the first conductive line and the second conductive line.

7. The interconnection structure of claim 6, wherein the first conductive line and the second conductive line each have a respective first surface opposite the substrate, the respective first surfaces of the first conductive line and the second conductive line are substantially coplanar and wherein the first surfaces of the first conductive line and the second conductive line are not coplanar with the surface of the substrate.

8. The interconnection structure of claim 7, wherein the second unitary interconnection structure has a first surface that is substantially coplanar with the first surfaces of the first and second conductive lines and the second unitary interconnection structure has a second surface, opposite the first surface of the second unitary interconnection structure, that is substantially coplanar with a surface of the interlayer dielectric opposite the surface of the substrate.

9. The interconnection structure of claim 8, wherein the second surface of the first unitary interconnection structure and the second surface of the second unitary interconnection structure are substantially coplanar.

10. The interconnection structure of claim 8, wherein the portion of the interlayer dielectric disposed on the third active region has a first surface opposite the substrate that is substantially coplanar with the first surfaces of the first and second conductive lines and the first surface of the second unitary interconnection structure.

11. The interconnection structure of claim 6, wherein the first unitary interconnection structure and the second unitary interconnection structure are made of the same conductive material.

12. The interconnection structure of claim 6, wherein the first and the second conductive lines are extended to cross over the first active region.

13. The interconnection structure of claim 12, wherein the first and the second conductive lines crossing the first active region are a gate electrode of pass transistors in an SRAM and the second unitary interconnection structure is a word line.

14. The interconnection structure of claim 7 further comprising:

a fourth active region in the substrate;

a MOS-transistor formed at the fourth active region; and a third unitary interconnection structure contacting and electrically connecting a gate electrode of the MOS-transistor to the fourth active region, the third unitary interconnection structure being disposed in the interlayer dielectric.

15. The interconnection structure of claim 14, wherein the first conductive line, the second conductive line and the gate electrode are made of at least one of polysilicon, silicide, and/or tungsten.

16. The interconnection structure of claim 14, wherein a first surface of the fourth active region is substantially coplanar with the surface of the substrate and a first surface of the gate electrode opposite the substrate is not substantially coplanar with the surface of the substrate.

17. The interconnection structure of claim 16, wherein the third unitary interconnection structure has a first surface that is substantially coplanar with the first surface of the fourth active region, a second surface that is substantially coplanar with the first surface of the gate electrode and a third surface, opposite the first surface and the second surface of the third unitary interconnection structure, that is substantially coplanar with a surface of the interlayer dielectric opposite the surface of the substrate.

18. The interconnection structure of claim 16, wherein the first, second and third unitary interconnection structures are the same material.

19. An interconnection structure of a semiconductor device, comprising a first active region disposed in a substrate, the first active region having a first surface that is substantially coplanar with a surface of the substrate;

a transistor formed at the first active region and having an electrode having a first surface that is opposite and spaced apart from the surface of the substrate;

an interlayer dielectric on the substrate;

a first unitary interconnection structure contacting and electrically connecting the first surface of the first active region and the first surface of the electrode, the first unitary interconnection structure being disposed in the interlayer dielectric;

a second active region in the substrate;

first and second field areas in the substrate and on opposite sides of the second active region;

a first conductive line on the first field area;

a second conductive line on the second field area;

a second unitary interconnection structure contacting the first conductive line and the second conductive line and electrically connecting the first conductive line to the second conductive line, the second unitary interconnection structure being disposed in the interlayer dielectric; and wherein a portion of the interlayer dielectric is disposed on the second active region and in a gap between the first conductive line and the second conductive line.

20. The interconnection structure of claim 19, wherein the first unitary interconnection structure has a first surface that is substantially coplanar with the first surface of the first active region, a second surface that is substantially coplanar with the first surface of the electrode and a third surface, opposite the substrate that is substantially coplanar with a surface of the interlayer dielectric that is opposite the substrate.

21. The interconnection structure of claim 19, wherein the first conductive line and the second conductive line each have a respective first surface opposite the substrate, the respective first surfaces of the first conductive line and the second conductive line are substantially coplanar and wherein the first surfaces of the first conductive line and the second conductive line are not coplanar with the surface of the substrate.

22. The interconnection structure of claim 21, wherein the second unitary interconnection structure has a first surface that is substantially coplanar with the first surfaces of the first and second conductive lines and the second unitary interconnection structure has a second surface, opposite the first surface of the second unitary interconnection structure, that is substantially coplanar with a surface of the interlayer dielectric opposite the surface of the substrate.

23. The interconnection structure of claim 21, wherein the first unitary interconnection structure has a first surface that is substantially coplanar with the first surface of the first active region, a second surface that is substantially coplanar with the first surface of the electrode and a third surface, opposite the substrate that is substantially coplanar with the surface of the interlayer dielectric that is opposite the substrate and wherein the third surface of the first unitary interconnection structure and the second surface of the second unitary interconnection structure are substantially coplanar.

24. The interconnection structure of claim 19, wherein the first unitary interconnection structure and the second unitary interconnection structure are the same material.

25. The interconnection structure of claim 19, wherein the interlayer dielectric comprises:

an etch stop layer on the substrate;

a first dielectric layer on the etch stop layer; and a second dielectric layer on the first dielectric layer opposite the etch stop layer.

26. The interconnection structure of claim 25, wherein the first dielectric layer and the second dielectric layer have different etch rates to respect to each other.

* * * * *

UNITED STATES PATENT AND TRADEMARK OFFICE
CERTIFICATE OF CORRECTION

PATENT NO. : 6,806,180 B2
DATED : October 19, 2004
INVENTOR(S) : Cho et al.

It is certified that error appears in the above-identified patent and that said Letters Patent is hereby corrected as shown below:

Column 14,
Line 66, should read -- 23. The interconnection structure of claim 22, wherein the --

Signed and Sealed this

First Day of March, 2005

JON W. DUDAS
*Director of the United States Patent and Trademark Office*